United States Patent
Li et al.

(10) Patent No.: US 12,218,267 B2
(45) Date of Patent: Feb. 4, 2025

(54) PREPARATION METHOD AND APPLICATION OF AN Er DOPED Ga2O3 FILM

(71) Applicant: ZHEJIANG UNIVERSITY, Hangzhou (CN)

(72) Inventors: Dongsheng Li, Hangzhou (CN); Deren Yang, Hangzhou (CN)

(73) Assignee: ZHEJIANG UNIVERSITY, Hangzhou (CN)

(*) Notice: Subject to any disclaimer, the term of this patent is extended or adjusted under 35 U.S.C. 154(b) by 419 days.

(21) Appl. No.: 17/789,191

(22) PCT Filed: Nov. 24, 2021

(86) PCT No.: PCT/CN2021/132711
§ 371 (c)(1),
(2) Date: Jun. 25, 2022

(87) PCT Pub. No.: WO2022/148165
PCT Pub. Date: Jul. 14, 2022

(65) Prior Publication Data
US 2023/0246115 A1    Aug. 3, 2023

(30) Foreign Application Priority Data
Jan. 11, 2021 (CN) .......................... 202110031291.0

(51) Int. Cl.
*H01L 31/109* (2006.01)
*C23C 14/06* (2006.01)
(Continued)

(52) U.S. Cl.
CPC ........ *H01L 31/109* (2013.01); *C23C 14/0688* (2013.01); *C23C 14/352* (2013.01); *H01L 31/0321* (2013.01)

(58) Field of Classification Search
CPC ............. H01L 2924/053; H01L 31/054; H01L 31/055; H01L 31/06; H01L 31/0321
See application file for complete search history.

(56) References Cited

U.S. PATENT DOCUMENTS

2020/0251621 A1* 8/2020 Zheng .............. C09K 11/77347

FOREIGN PATENT DOCUMENTS

| CN | 104124316 | 10/2014 |
| CN | 107119258 | 9/2017 |

(Continued)

OTHER PUBLICATIONS

Yang Y., et al., Low-voltage driven visible and infrared electroluminescence from light-emitting device based on Er-doped TiO2/p+-Si heterostructure. Applied Physics Letters, 2012, 100 (3): p. 031103.

(Continued)

*Primary Examiner* — Jaehwan Oh
(74) *Attorney, Agent, or Firm* — Jiwen Chen; Joywin IP Law PLLC

(57) ABSTRACT

The present invention discloses an Er doped $Ga_2O_3$ film, together with its preparation method and the application in the field of luminescence. The preparation method contains steps of: (1) the films are deposited by means of Radio-Frequency magnetron sputtering onto the heated substrates after the pre-sputtering for at least 5 minutes, selecting Er doped $Ga_2O_3$ target or Er and $Ga_2O_3$ targets, with the ambient of Ar and $O_2$; (2) the films as prepared in step (1) are thermally treated at the temperature higher than 300° C. in the ambient of $O_2$ or $N_2$, in order to optically activate $Er^{3+}$ and crystalize $Ga_2O_3$ hosts meanwhile, followed by natural cooling, obtaining the Er doped $Ga_2O_3$ films as described. The preparation technology of the present invention is simple, with a good process compatibility. It is believed that (Continued)

the present invention will be widely used in the field of silicon-based integrated light sources, semiconductor luminescence, optical communication, with broad application prospects.

12 Claims, 3 Drawing Sheets

(51) Int. Cl.
*C23C 14/35* (2006.01)
*H01L 31/032* (2006.01)

(56) References Cited

FOREIGN PATENT DOCUMENTS

| CN | 111304739 | 6/2020 |
| CN | 111653652 | 9/2020 |

OTHER PUBLICATIONS

Chen Z., et al., Efficient pure green emission from Er-doped $Ga_2O_3$ films [J]. Cryst. Eng. Comm. 2017, 19(31): 4448-4458.

* cited by examiner

PREPARATION METHOD AND APPLICATION OF AN Er DOPED Ga2O3 FILM

This is a U.S. national stage application of PCT Application No. PCT/CN2021/132711under 35 U.S.C. 371, filed Nov. 24, 2021 in Chinese, claiming priority from Chinese Application No. 202110031291.0 filed Jan. 11, 2021, all of which are hereby incorporated by reference.

Field of the invention

The present invention relates to the technology of silicon-based optoelectronics, involving a specific erbium doped $Ga_2O_3$ film as well as its preparation method and application.

BACKGROUND OF THE INVENTION

With the rapid development of micro-electronics industry and Moore Law, the number of transistors on a single chip is boosting, leading to the increasingly severe problems of signal delay caused by the interconnection of metal wire, heat release and signal interference in turn. Due to the advantages of fast transmission, low loss, tiny interference, optical interconnection is turning into the promising and indispensable key-step for the development of the integrated circuit.

Up to now, significant progresses have been made in silicon-based optical interconnection in optical waveguides, optical signal modulators, amplifiers, and detectors. However, little breakthrough has been acquired in view of highly efficient light sources, especially light sources compatible with mature CMOS technologies for electroluminescence (EL). Because the characteristic emission peak of 1535 nm for $Er^{3+}$ is in the minimum-loss window of quartz fiber and compatible with the current CMOS technology, Er doped silicon based light source has always been a hot area of research.

To enhance the concentration of Er doping and decrease the onset voltage, silicon based pn junction, insulating compounds of silicon like $SiO_x$, $SiN_x$, SiNO, $Si_2Er_2O_7$, narrow bandgap semiconductor, such as GaAs, InP, have been selected as hosts for Er incorporation. However, for the narrow bandgap semiconductors like Si, GaAs, InP, the emission efficiency of Er is restrained due to the limitation of low solid solubility of Er, along with the severe back energy transfer caused by the Auger effect of the matrixes. On the other hand, the insulating characteristics of $SiO_x$ and $Si_2Er_2O_7$ will lead to the turn-on voltage of more than 70 V, while the native defects within $SiN_x$ and SiNO, together with the ones brought by the introduction of Si-rich, will result in the dramatic decrease of the device efficiency.

For the purpose of reducing the onset voltage and increasing the efficiency of energy transfer, wide bandgap semiconductors, like GaN, ZnO, $TiO_2$, have been considered as ideal doping hosts. For instance, "Yang Y, et al., *Low-voltage driven visible and infrared electroluminescence from light-emitting device based on Er-doped TiO₂/p+-Si heterostructure. Applied Physics Letters,* 2012. 100(3): p. 031103." has achieved the incorporation of $Er^{3+}$ into $TiO_2$, with the doping concentration of $10^{20}$ $cm^{-3}$ and EL threshold voltage less than 10 V. For GaN, because of the similar radius of $Er^{3+}$ and $Ga^{3+}$, the equivalent substitution of $Ga^{3+}$ with $Er^{3+}$ will create little lattice distortion and few electrical defects, whereas ErN compounds without optical activity will be produced, affecting the efficiency. While in terms of oxides such as $TiO_2$ and ZnO, optical active compounds of ErO will be created, which can prevent $Er^{3+}$ from segregating. Furthermore, oxygen vacancies in metal oxides can activate $Er^{3+}$, beneficial for $Er^{3+}$ emission. However, electrical defects will be produced as a result of the inequivalent doping of $Er^{3+}$, adverse for luminescence.

Based on these EL devices prepared by erbium-doped thin films, researches on the structure of the devices have been reported. For example, "Ma X., et al., An inorganic electroluminescence device and its preparation. Zhejiang: CN104124316A,2014 Oct. 29." has demonstrated that the confinement effect of carriers within the active layers can be enhanced in virtue of the addition of the first and second barrier layer, i.e., more carriers will accumulate inside the luminescence layer. However, the current research lacks exploration and regulation of the luminescence mechanism of the device. Exactly how the carriers excite the erbium ions, and whether the electrons or holes complete the excitation of the erbium ions, has not been explored, and there is no corresponding regulation.

As a result, the key point for silicon based EL devices lies in the lack of a perfect Er doping matrix, which can help to obtain the efficient near infrared (NIR) EL with a low threshold voltage, together with the research on the emission mechanism and the macroscopic design of the devices.

Aiming at the deficiencies of this field: namely (1) the lack of a qualified host for $Er^{3+}$ luminescence, which ensures a low onset voltage, little electrical and mechanical defects after $Er^{3+}$ incorporation, and avoids the back energy transfer from $Er^{3+}$ towards the matrix simultaneously; (2) the lack of analysis on the mechanism of the EL device and the macroscopic design of the device for efficient $Er^{3+}$ emission, the present invention comes up with a new doping host, $Ga_2O_3$. No researches on the NIR EL of Er doped $Ga_2O_3$ ($Ga_2O_3$: Er) have been reported yet. While "Chen Z., et al., *Efficient pure green emission from Er-doped Ga₂O₃ films[J]. Cryst. Eng. Comm.* 2017, 19(31): 4448-4458." has reported that $Ga_2O_3$: Er films have been prepared via pulsed laser deposition (PLD) on p-Si substrates. However, the films deposited by such single-step PLD technology contain more defects, where electrons recombine with holes and transfer the energy released to $Er^{3+}$ nearby. It is proved that only visible EL can be achieved, which is opposite from the aim of the research. The present invention provides the method of depositing the $Ga_2O_3$: Er film using Radio-Frequency (RF) magnetron sputtering on different substrates. In the present invention, dense films can be prepared and the oxygen vacancies of the films can be eliminated by means of heat treatment in $O_2$ ambient, during which the $Ga_2O_3$ host can be crystallized. The present invention also exhibits that $Er^{3+}$ incorporation can be obtained by substituting $Ga^{3+}$. Additionally, two $Ga_2O_3$: Er based NIR EL devices can be fabricated in the present invention with different structures and mechanisms in virtue of controlling the direction of the applied voltage and analyzing the behaviors of the carriers.

SUMMARY OF THE INVENTION

Based on the technological problems and shortcomings of this field, the present invention provides a method of preparing $Ga_2O_3$: Er films by RF magnetron sputtering and high temperature thermal treatment afterwards to form grains of $Ga_2O_3$: Er.

A method of preparing $Ga_2O_3$: Er film (erbium-doped gallium oxide thin film) comprises the following steps:

(1) Er doped $Ga_2O_3$ targets or pure Er and pure $Ga_2O_3$ targets are selected for the RF magnetron sputtering. The chamber evacuated to vacuum in advance is inlet with Ar and $O_2$ for sputtering, which begins after pre-sputtering for 5 min. The substrates used here are p-Si or thermally oxidized n-Si, which are heated during sputtering.

(2) High-temperature heat treatment is carried out for films deposited from (1) in the ambient of $O_2$ or $N_2$ at the temperature higher than 300° C., aiming at crystalizing $Ga_2O_3$ and activating Er at the same time. Following the natural cooling, the $Ga_2O_3$: Er films as described are obtained. The $Ga_2O_3$: Er films as described above can be further fabricated into EL devices. For the $Ga_2O_3$: Er films and the EL devices, the selection of the substrates and the direction of the electrodes determine the electrical and EL properties. For example, if heavily doped p-Si is used as the substrates, the main part of the EL device will be the heterojunction of $Ga_2O_3$: Er/Si, and the EL will result from the recombination between electrons and holes, with p-Si connected with the positive part of the power; while if heavily doped thermally oxidized n-Si is selected and connected with the negative part of the power, the main part of the EL device will be the Semiconductor-Oxide-Semiconductor (SOS) structure of $Ga_2O_3$:Er—$SiO_2$—Si and the EL will lie in the hot-electrons which are produced by the FN tunneling of the electrons from one side of n-Si and the impact between hot-electrons and $Er^{3+}$. The mechanism is totally different from the one in the patent of CN104124316A, which utilizes the first and second barrier layers to enhance the carriers.

Among the preparation methods as described, thermal treatment is necessary in order to promote the crystallization of the $Ga_2O_3$ hosts and the substitution doping of $Er^{3+}$. In the step (2), the temperature of the thermal treatment can be selected according to the need, so that the crystallinity of the films and the grain sizes can be controlled for stable and intense EL.

In step (2) of the preparation methods as described, $O_2$ ambient is preferred.

In step (2) of the preparation methods as described, natural cooling with the furnace is better than shock cooling, as the devices will suffer from the inner stress of the films because of the shock cooling, adverse for the stability of the devices.

For the $Ga_2O_3$: Er films in the present invention, the electrical and EL properties are determined by the ratio of different elements and the thickness of the film. The elements ratio relies on the percentage of $O_2$ in the mixed gas, while the thickness depends on the power and time of the sputtering.

For optimization, the temperature of the heated substrates in step (1) is higher than 100° C.; the vacuum degree is no more than $5\times10^{\times 3}$ Pa; the ratio of the volume flow of $O_2$ and Ar is 2:1~2:40; during the sputtering, the $Ga_2O_3$: Er target is fed with the power of 10-190 W, while the Er and $Ga_2O_3$ targets are fed with the power of 5-50 W and 50-190 W, respectively; the pressure of the sputtering chamber is 0.1-10 Pa; the sputtering lasts for 5-60 min. For further selection, the $Ga_2O_3$: Er target is fed with the power of 100-140 W.

The present invention provides the preparation method of the $Ga_2O_3$: Er film and the $Ga_2O_3$: Er films as described.

$Ga_2O_3$: Er crystals are created within the $Ga_2O_3$: Er films prepared following the methods above, with the grain size of 10-100 nm.

The present invention also provides the application of the $Ga_2O_3$: Er film as described in the field of luminescence. For example, 2 different EL devices based on this film can be fabricated.

As a general inventive concept, the present invention provides a NIR EL device based on the impact of hot-electrons, utilizing the $Ga_2O_3$: Er films mentioned above and thermally oxidized n-Si as substrates.

For the $Ga_2O_3$: Er films as described above, metal back electrodes are deposited on the backside of the substrates, connected with the negative side of the power, while the transparent indium tin oxide (ITO) electrodes are deposited on top of the $Ga_2O_3$: Er layer, connected with the positive side of the power.

The onset voltage of the NIR EL device as described is lower than 20 V, with the merits of high emission efficiency and long operation lifetime, which can be applied in the field of silicon-based integrated light sources, semiconductor luminescence and optical communication.

The present invention also proposes another kind of NIR EL device based on the recombination of electrons and holes, selecting the $Ga_2O_3$: Er described above and p-Si as substrates.

For the $Ga_2O_3$: Er films as described, metal back electrodes are deposited on the backside of the substrates, connected with the positive side of the power, while the transparent ITO electrodes are deposited on top of the $Ga_2O_3$: Er layer, connected with the negative side of the power.

The onset voltage of the NIR EL device as described is lower than 6 V, with the advantage of excellent stability, which can be applied in the field of silicon-based integrated light sources, semiconductor luminescence and optical communication.

The key to the high performance of the NIR EL devices lies in the $Ga_2O_3$: Er films prepared by means of RF magnetron sputtering-high temperature thermal treatment as mentioned in the present invention.

The ITO transparent electrodes and metal back electrodes used in the 2 NIR EL devices mentioned above can be prepared by the general deposition method, like conventional direct-current sputtering with targets of indium tin oxide (ITO) and metal.

The present invention solves the current problem of lacking qualified hosts for EL. The preparation technology of the present invention is simple, with a good process compatibility. It is believed that the present invention will be widely used in the field of silicon-based integrated light sources, semiconductor luminescence, optical communication, with broad application prospects.

Compared with the current technology, the breakthrough of the present invention is that $Ga_2O_3$: Er films deposited in virtue of RF magnetron sputtering-high temperature thermal treatment are selected as the hosts for Er doping EL. The main advantages are:

(1) $Ga_2O_3$ possesses a wide bandgap (4.8 eV) to avoid the energy back transfer caused by Auger effect, enhancing the emission intensity and efficiency. (2) The conductivity of the film is increased due to the high mobility of the wide bandgap $Ga_2O_3$ (80-100 $cm^2/V\cdot s$), reducing the threshold voltage of the device. (3) The trivalent $Ga^{3+}$ can be equivalently replaced by $Er^{3+}$, without new electrical defects. (4) The monoclinic structure of $Ga_2O_3$ with low crystal field symmetry, where $Ga^{3+}$ is in the center of octahedrons and tetrahedrons composed of $O^{2-}$, enhances the optical activity of $Er^{3+}$. (5) The emission peaks belonging to the native oxygen vacancies are situated at 380 nm and 525 nm, which correspond to the 2 excited states of $Er^{3+}$, beneficial for the energy transfer from $Ga_2O_3$ to $Er^{3+}$. (6) two kinds of EL devices with different emission mechanisms can be acquired by regulating the direction of the voltage applied and the device fabrication. For the recombination devices, the current is higher and the onset voltage is lower, with the electrons and holes injecting from ITO electrodes and p-Si towards $Ga_2O_3$: Er active layer, respectively. Additionally, due to the lower concentration of the defects via the RF magnetron sputtering as described than the traditional method of PLD, the electrons and holes will be more likely to recombine at the $Er^{3+}$ center, contributing to the intense NIR EL of $Er^{3+}$. On the other hand, for the other NIR EL device, the electrons enter the conduction band of $SiO_x$ by FN tunneling, becoming the hot-electrons. Due to the low density of defects in the $SiO_x$ layer, electrons can gain energy for hot-electrons more easily, thus the possibility of impacting and exciting $Er^{3+}$ for emission is higher, realizing the NIR luminescence. Because of the existence of the $SiO_x$ layer, the current through the device is small, so that the external quantum efficiency is higher with a longer lifetime.

As a result, two EL devices based on different luminescence mechanisms are fabricated by selecting the $Ga_2O_3$: Er prepared in the way of RF magnetron sputtering-high temperature thermal treatment and designing the structure of the devices. Specifically, the device based on recombination may realize the distribution for population inversion, achieving the silicon-based Er doped NIR laser after increasing the current. While the current through the device based on impacting of hot-electrons is small, beneficial for the enhancement of the emission efficiency and the operation lifetime. The whole preparation process is simple and mature, with the prospect of industrial application.

DETAILED DESCRIPTION OF THE INVENTION

The present invention will be elaborated further combined with the figures and specific embodiments. Take note that the embodiments are only applicable to the present invention, but not used to restrain the scope of the invention. Detailed operation methods of the specific conditions are not indicated in the following embodiments. Instead, conventional conditions or the ones recommended by manufacturers are preferable.

Figure 1:
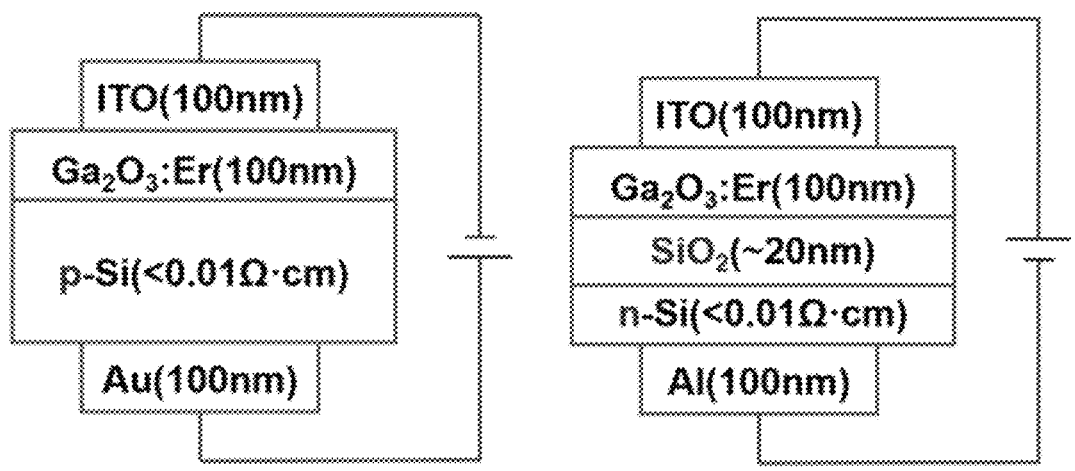
FIG. 1 depicts the structure of the 2 typical devices based on the recombination of electrons and holes (left side) and impact of hot-electrons (right side), respectively.

In this embodiment, the EL devices based on Er doped $Ga_2O_3$ films are fabricated by means of RF magnetron sputtering, selecting Czochralski (CZ) single side polished p-silicon wafers with the crystal orientation of (100), electrical resistivity of less than 0.01 Ω·cm and CZ single side oxidized ($SiO_2$ thickness of ~20 nm) n-silicon wafers with the crystal orientation of (100), electrical resistivity of less than 0.01 Ω·cm as the substrates. During sputtering, the substrates are heated up to 150° C., and the chamber evacuated to the vacuum degree of $5\times10^{-3}$ Pa in advance is inlet with the mixture gas of pure Ar and $O_2$ to the pressure of 1 Pa, with the gas entry rate of 7.5:32.5. The $Ga_2O_3$ target doped with erbium-gallium molar ratio of 2:98 is used, fed with the power of 120 W. After pre-sputtering for 5 minutes, the baffles are removed and the formal sputtering lasts for 35 minutes. The as sputtered films are thermally treated in the ambient of $O_2$ at 700° C. for 2 hours, heated and cooled down along with the furnace. Subsequently, the Au and Al electrodes are direct current (DC) sputtered onto one side of the p-Si and thermally oxidized n-Si, respectively, forming the Ohmic contact. Finally, ITO transparent electrodes are sputtered onto another side of the films, leading to the LED devices depicted in FIG. 1. The thicknesses of the ITO layer, the $Ga_2O_3$: Er layer, the Au and Al electrodes are about 100 nm.

The detailed preparation methods are as follows:

(1) For the p-Si wafers, standard RCA cleaning is firstly carried out, then diluted HF is used to eliminate the oxidization layer on the surface of the wafers. For the thermally oxidized n-Si, $N_2$ is directly used to remove the dust. Subsequently, the wafers are moved into the chamber of the RF sputtering device, which will be evacuated to the vacuum degree of $2\times10^{\times3}$ Pa later. Meanwhile, the substrate is heated up to 150° C. After that, the chamber is inlet with pure $O_2$ and Ar (the entry rate of the $O_2$ and Ar are 7.5 mL/min and 32.5 mL/min, respectively) to the working pressure of 1 Pa. The $Ga_2O_3$: Er target with erbium-gallium molar ratio of 2:98 is selected. Finally, after the pre-sputtering of 5 minutes, the baffles are moved and the $Ga_2O_3$: Er films are deposited on the substrates.

Figure 2:
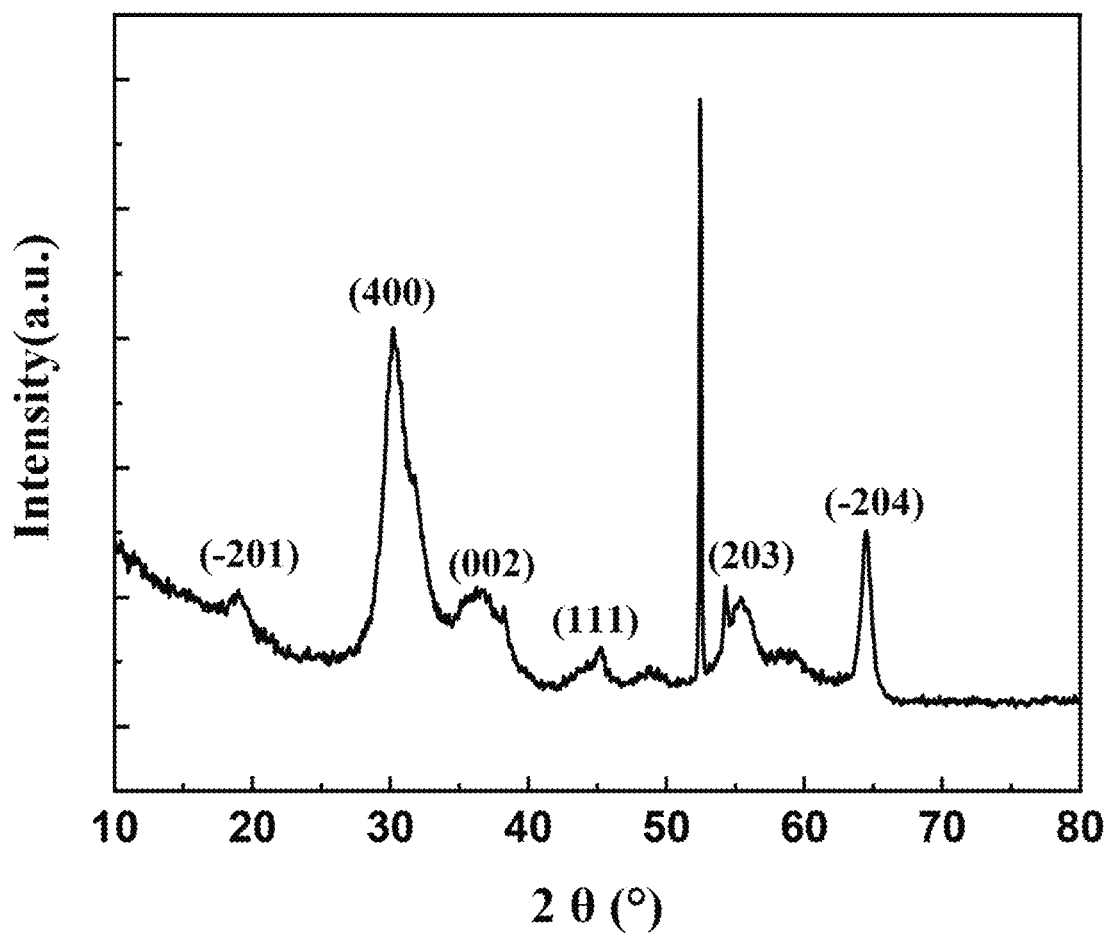
FIG. 2 exhibits the X-ray diffraction (XRD) patterns of the films after thermal treatment, where the corresponding crystal planes are labeled.
Figure 3:
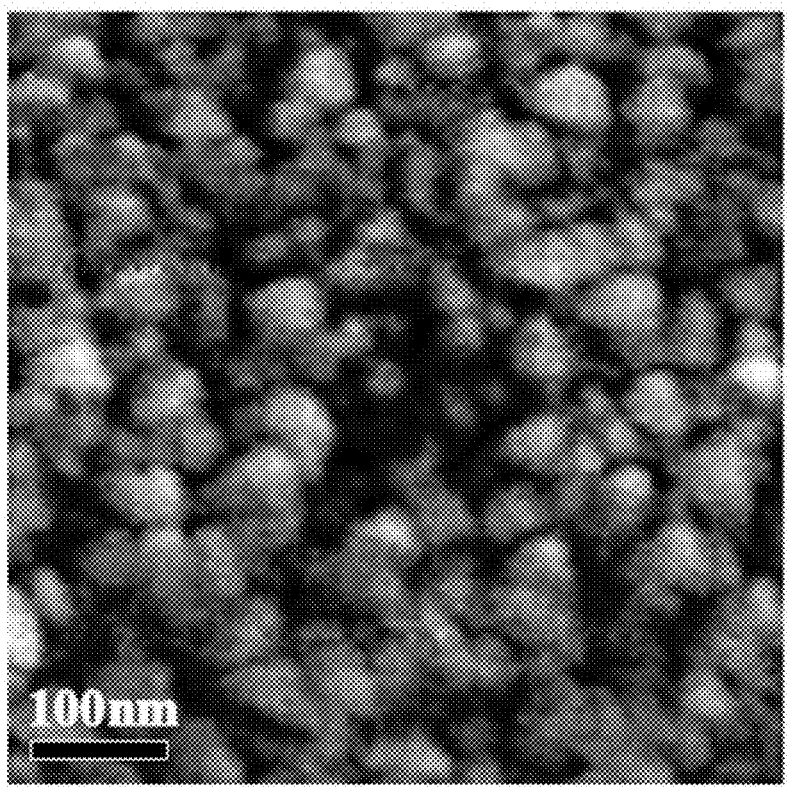
FIG. 3 shows the image of the film thermally treated at 700° C. in $O_2$ for 2 hours, acquired by an atomic force microscope (AFM).

(2) The films as prepared above are thermally treated in the ambient of pure $O_2$ using the vacuum tube furnace at 700° C. for 2 hours, cooled down with the furnace subsequently, in order to make $Er^{3+}$ distribute evenly and crystalize the $Ga_2O_3$ hosts. It can be indicated that crystals of $Ga_2O_3$ are produced within the films from FIGS. 2 and 3, with the diameter of 50 nm.

(3) Diluted HF is coated onto the back side of the treated samples to eliminate the surface oxidization layer. Later, the samples are moved into the chamber of the DC magnetron sputtering, which is evacuated to the vacuum degree of $5\times10^{-3}$ Pa and then inlet with pure Ar to the pressure of 5 Pa. Metal electrodes are deposited onto the backside of the samples which are heated up to 150° C. via high purity Au or Al targets.

(4) The samples are moved into the chamber of the DC magnetron sputtering, evacuated to the vacuum degree of $5\times10^{\times3}$ Pa and inlet with pure Ar to the pressure of 0.2 Pa. ITO transparent electrodes are deposited onto the front side of the samples which are heated up to 150° C. via ITO targets.

Figure 4:
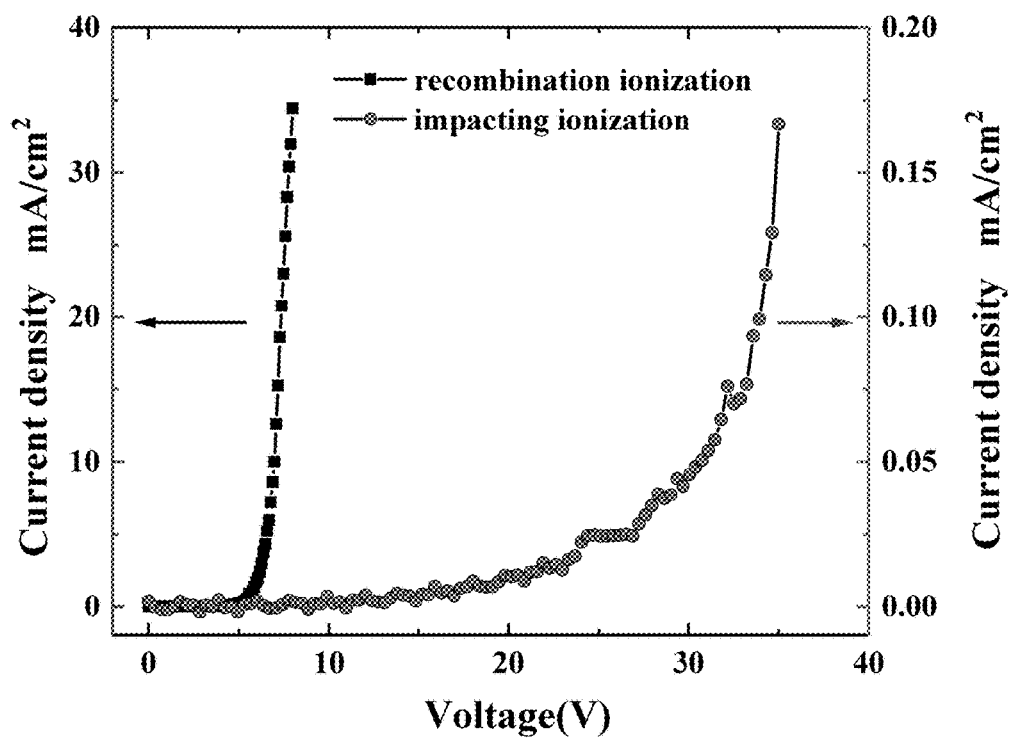
FIG. 4 displays the representative current-voltage (I-V) characteristic curves for the devices based on the recombination of electrons and holes (left side) and impact of hot-electrons (right side), respectively.

(5) DC voltage is applied to the as-prepared devices for I-V measurements, as exhibited in FIG. 4. It can be demonstrated that the onset voltages of the devices based on p-Si and thermally oxidized n-Si are less than 6 V and 20 V, respectively. For the devices based on thermally oxidized n-Si, the current density of the device is relatively low, leading to the high efficiency, especially the external quantum efficiency.

Figure 5:
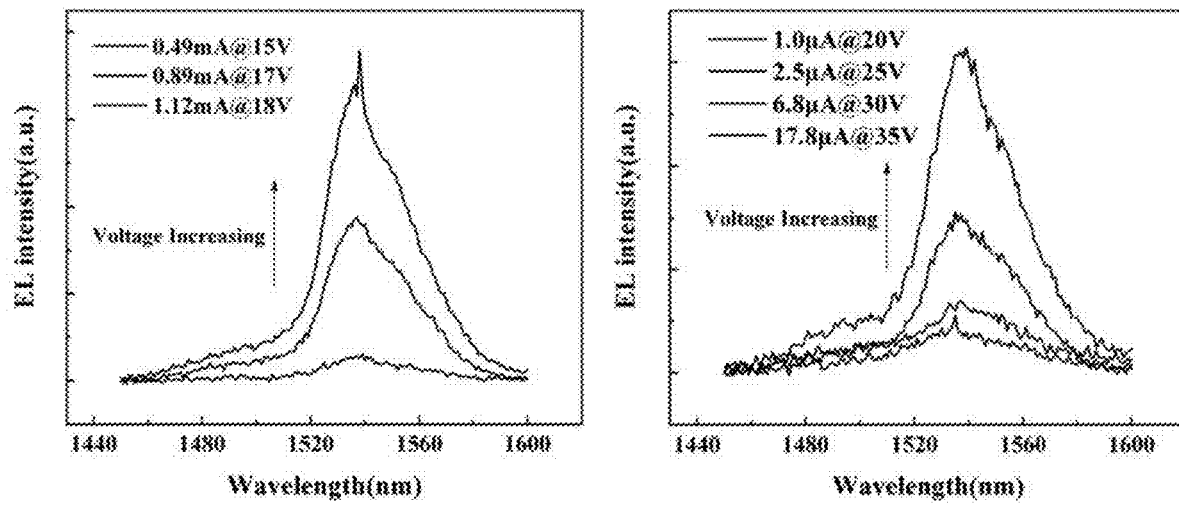
FIG. 5 presents the EL spectra of the devices based on the recombination of electrons and holes (left side) and impact of hot-electrons (right side), respectively. The condition of the current and voltage during the EL measurement is explained by the labels of the figure.

(6) EL measurements are carried out for the as-prepared devices, as shown in FIG. 5, where sharp emission peaks located at ~1540 nm can be clearly observed for both devices. Lower working voltage can be acquired for the devices based on p-Si, while the current the devices based on n-Si is lower, with a higher external quantum efficiency instead.

Additionally, various modifications or alternatives made by those skilled in the art after reading the descriptions above are also involved in the scope of this application.

The invention claimed is:

1. A near infrared electroluminescent device based on the impact of hot-electrons, characterized in that the device uses $Ga_2O_3$: Er films, whose preparation method comprising the steps of:
  (1) in a vacuum chamber, introducing mixed gas of Ar and $O_2$, using Radio-Frequency magnetron sputtering method to sputter the erbium-doped gallium oxide target or co-sputter the erbium target and the gallium oxide target, after sputtering a blacking plate for 5 minutes, then starting sputtering deposition an erbium-doped gallium oxide film on a heated substrate; the substrate being thermally oxidized n-type silicon;
  (2) under an atmosphere of oxygen or nitrogen, subjecting the erbium-doped gallium oxide film obtained in step (1) to a high temperature heat treatment above 300° C. to crystallize the gallium oxide while activating the erbium, and then naturally cooling down to obtain the erbium-doped gallium oxide film;
  wherein one side of the substrate of the erbium-doped gallium oxide film is deposited with a metal back electrode for connecting to the negative electrode of the power supply, and another side of the erbium-doped gallium oxide film is deposited with an indium tin oxide (ITO) transparent electrode for connecting to the positive electrode of the power supply; and
  wherein an onset voltage of the near-infrared electroluminescent device based on hot electron impact ionization is lower than 20 V.

2. The near-infrared electroluminescent device based on hot electron impact ionization according to claim 1, characterized in that: during the preparation method in step (1), the temperature of the substrate is higher than 100° C.; the vacuum degree is no more than $5 \times 10^{-3}$ Pa; the ratio of the volume flow is 2:1~2:40; during the sputtering, the $Ga_2O_3$: Er target is fed with the power of 10-190 W, the Er and $Ga_2O_3$ targets are fed with the power of 5-50 W and 50-190 W, respectively; the pressure of the sputtering chamber is 0.1-10 Pa; the sputtering lasts for 5-60 min.

3. The near-infrared electroluminescent device based on hot electron impact ionization according to claim 1, characterized in that: $Ga_2O_3$: Er crystals are produced within the $Ga_2O_3$: Er films, whose grain diameters are 10-100 nm.

4. A near-infrared electroluminescent device based on the recombination of electrons and holes, characterized in that the device uses $Ga_2O_3$: Er films, whose preparation method comprises:
  (1) in a vacuum chamber, introducing mixed gas of Ar and $O_2$, using Radio-Frequency magnetron sputtering method to sputter the erbium-doped gallium oxide target or co-sputter the erbium target and the gallium oxide target, after sputtering a blacking plate for 5 minutes, then starting sputtering deposition an erbium-doped gallium oxide film on a heated substrate; the substrate being p-type silicon;
  (2) under an atmosphere of oxygen or nitrogen, subjecting the erbium-doped gallium oxide film obtained in step (1) to a high temperature heat treatment above 300° C. to crystallize the gallium oxide while activating the erbium, and then naturally cooling down to obtain the erbium-doped gallium oxide film;
  wherein one side of the substrate of the erbium-doped gallium oxide film is deposited with a metal back electrode for connecting to the positive electrode of the power supply, and another side of the erbium-doped gallium oxide film is deposited with an indium tin oxide (ITO) transparent electrode for connecting to the negative electrode of the power supply; and
  wherein an onset voltage of the near-infrared electroluminescent device based on the recombination of electrons and holes is lower than 6 V.

5. The near-infrared electroluminescent device NIR EL LED based on the recombination of electrons and holes according to claim 4, characterizes in that: during the preparation method in step (1), the temperature of the substrate is higher than 100° C.; the vacuum degree is no more than $5 \times 10^{-3}$ Pa; the ratio of the volume flow is 2:1~2:40; during the sputtering, the $Ga_2O_3$: Er target is fed with the power of 10-190 W, the Er and $Ga_2O_3$ targets are fed with the power of 5-50 W and 50-190 W, respectively; the pressure of the sputtering chamber is 0.1-10 Pa; the sputtering lasts for 5-60 min.

6. The near-infrared electroluminescent device NIR EL LED based on the recombination of electrons and holes according to claim 4, characterized in that: $Ga_2O_3$: Er crystals are produced within the $Ga_2O_3$: Er films, whose grain diameters are 10-100 nm.

7. A method of using Erbium-doped gallium oxide thin films in near infrared electroluminescent devices, wherein the Erbium-doped gallium oxide thin film is prepared by the following steps:
  (1) in a vacuum chamber, introducing mixed gas of Ar and $O_2$, using Radio-Frequency magnetron sputtering method to sputter the erbium-doped gallium oxide target or co-sputter the erbium target and the gallium oxide target, after sputtering a blacking plate for 5 minutes, then starting sputtering deposition an erbium-doped gallium oxide film on a heated substrate; the substrate being p-type silicon; or thermally oxidized n-type silicon;
  (2) under an atmosphere of oxygen or nitrogen, subjecting the erbium-doped gallium oxide film obtained in step (1) to a high temperature heat treatment above 300° C. to crystallize the gallium oxide while activating the erbium, and then naturally cooling down to obtain the erbium-doped gallium oxide film.

8. The method according to claim 7, wherein during the preparation method in step (1), the temperature of the substrate is higher than 100° C.; the vacuum degree is no more than $5 \times 10^{-3}$ Pa; the ratio of the volume flow is 2:1~2:40; during the sputtering, the $Ga_2O_3$: Er target is fed with the power of 10-190 W, the Er and $Ga_2O_3$ targets are fed with the power of 5-50 W and 50-190 W, respectively; the pressure of the sputtering chamber is 0.1-10 Pa; the sputtering lasts for 5-60 min.

9. The method according to claim 7, characterized in that: $Ga_2O_3$: Er crystals are produced within $Ga_2O_3$: Er films, whose grain diameters are 10-100 nm.

10. The near-infrared electroluminescent device based on hot electron impact ionization according to claim 2, characterized in that: $Ga_2O_3$: Er crystals are produced within the $Ga_2O_3$: Er films, whose grain diameters are 10-100 nm.

11. The near-infrared electroluminescent device NIR EL LED based on the recombination of electrons and holes according to claim 5, characterized in that: $Ga_2O_3$: Er crystals are produced within the $Ga_2O_3$: Er films, whose grain diameters are 10-100 nm.

12. The method according to claim 8, characterized in that: $Ga_2O_3$: Er crystals are produced within $Ga_2O_3$: Er films, whose grain diameters are 10-100 nm.

\* \* \* \* \*